US009455730B1

(12) United States Patent
Friend et al.

(10) Patent No.: US 9,455,730 B1
(45) Date of Patent: Sep. 27, 2016

(54) VOLTAGE CONTROLLED OSCILLATOR RUNAWAY PREVENTION

(71) Applicant: International Business Machines Corporation, Armonk, NY (US)

(72) Inventors: David M. Friend, Rochester, MN (US); James D. Strom, Rochester, MN (US); Alan P. Wagstaff, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/733,993

(22) Filed: Jun. 9, 2015

Related U.S. Application Data

(63) Continuation of application No. 14/671,259, filed on Mar. 27, 2015.

(51) Int. Cl.
*H03L 7/06* (2006.01)
*H03L 7/14* (2006.01)

(52) U.S. Cl.
CPC ...................................... *H03L 7/14* (2013.01)

(58) Field of Classification Search
USPC ................... 327/147–149, 156–158
See application file for complete search history.

(56) References Cited

U.S. PATENT DOCUMENTS

| | | | |
|---|---|---|---|
| 5,457,428 A | 10/1995 | Alder et al. | |
| 5,694,087 A * | 12/1997 | Ferraiolo | H03L 7/10 331/11 |
| 5,864,572 A * | 1/1999 | Bhagwan | G06F 1/04 714/798 |
| 6,140,880 A * | 10/2000 | Moyal | H03L 7/10 331/1 A |
| 6,177,843 B1 | 1/2001 | Chou et al. | |
| 6,369,660 B1 * | 4/2002 | Wei | H03L 7/10 327/156 |
| 6,782,068 B1 | 8/2004 | Wilson et al. | |
| 7,388,440 B1 | 6/2008 | Giust et al. | |
| 7,518,420 B1 | 4/2009 | Stiff | |
| 8,237,513 B2 | 8/2012 | Muench et al. | |
| 8,810,320 B1 | 8/2014 | Bazes | |
| 2008/0036543 A1* | 2/2008 | Bazes | H03L 7/02 331/8 |
| 2011/0181326 A1* | 7/2011 | Sanchez | H03L 7/14 327/148 |
| 2011/0316593 A1* | 12/2011 | Muench | H03L 3/00 327/147 |
| 2012/0133413 A1* | 5/2012 | Ficke | H03K 4/94 327/333 |
| 2014/0143595 A1* | 5/2014 | Abdukadir | G06F 11/0706 714/12 |
| 2015/0249383 A1* | 9/2015 | Li | H02M 3/073 327/536 |

OTHER PUBLICATIONS

Friend, et al., "Voltage Controlled Oscillator Runaway Prevention," U.S. Appl. No. 14/992,164, filed Jan. 11, 2016.
List of Patents or Patent Applications Treated as Related, Dated Jan. 8, 2016, 2 pages.
"Accelerated Examination Support Document," International Business Machines Corporation, Dated Jan. 6, 2016, 11 pages.
Nishikawa, H., "Circuit for Avoiding VCO Runaway in PLL," IBM, Jun. 1, 1994. IP.com No. 000112778. IP.com Electronic Publication: Mar. 27, 2005. 3 pages.
Friend et al., "Voltage Controlled Oscillator Runaway Prevention", U.S. Appl. No. 14/671,259, filed Mar. 27, 2015.
List of IBM Patents or Patent Applications Treated as Related.

* cited by examiner

*Primary Examiner* — Adam Houston
(74) *Attorney, Agent, or Firm* — Mark G. Edwards; Robert Williams

(57) ABSTRACT

A feedback module for preventing voltage controlled oscillator (VCO) runaway in a phase locked loop (PLL) circuit can include a first, a second, and a third input to receive a first output signal from a PLL circuit, a reference signal, and a first control signal. The feedback module may also include a feedback circuit to generate a second control signal, the second control signal being coupled to an input of the PLL circuit, wherein the feedback circuit generates the second control signal by comparing a number of cycles of the first output signal to a first threshold, and a number of cycles of the reference signal to a second threshold.

6 Claims, 6 Drawing Sheets

VOLTAGE CONTROLLED OSCILLATOR RUNAWAY PREVENTION

BACKGROUND

The present disclosure relates to electronic circuits, and more specifically, to an electronic circuit that can prevent voltage controlled oscillator runaway in a phase locked loop circuit.

Phase locked loop circuits include control systems that can generate an output signal having a phase that is related to an input signal. Electronic systems, including those concerned with radio, telecommunications, and computing may use phase locked loop (PLL) circuits for clock distribution, signal recovery, and frequency synthesis. Low noise/jitter PLL circuits may be important to certain systems (e.g., servers, gaming devices, and cloud computing infrastructure) whose architecture require high precision frequency control of signals.

SUMMARY

According to embodiments of the present disclosure, a feedback module for preventing voltage controlled oscillator (VCO) runaway in a phase locked loop (PLL) circuit can include a first, a second, and a third input to receive a first output signal from a PLL circuit, a reference signal, and a first control signal. The feedback module may also include a feedback circuit to generate a second control signal, the second control signal being coupled to an input of the PLL circuit, wherein the feedback circuit generates the second control signal by comparing a number of cycles of the first output signal to a first threshold, and a number of cycles of the reference signal to a second threshold.

Various embodiments are directed towards a method for preventing voltage controlled oscillator (VCO) runaway in a phase locked loop (PLL) circuit. The method may include providing a feedback module having a first, a second, and a third input to receive a first output signal from a PLL circuit, a reference signal, and a first control signal. The method may then include generating a second control signal from a feedback circuit, the second control signal being coupled to an input of the PLL circuit, wherein the feedback circuit generates the second control signal by comparing a number of cycles of the first output signal to a first threshold, and a number of cycles of the reference signal to a second threshold.

Other embodiments are directed towards a design structure tangibly embodied in a machine readable medium for designing, manufacturing, or testing an integrated circuit, the design structure specifying a feedback module for preventing voltage controlled oscillator (VCO) runaway in a phase locked loop (PLL) circuit.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
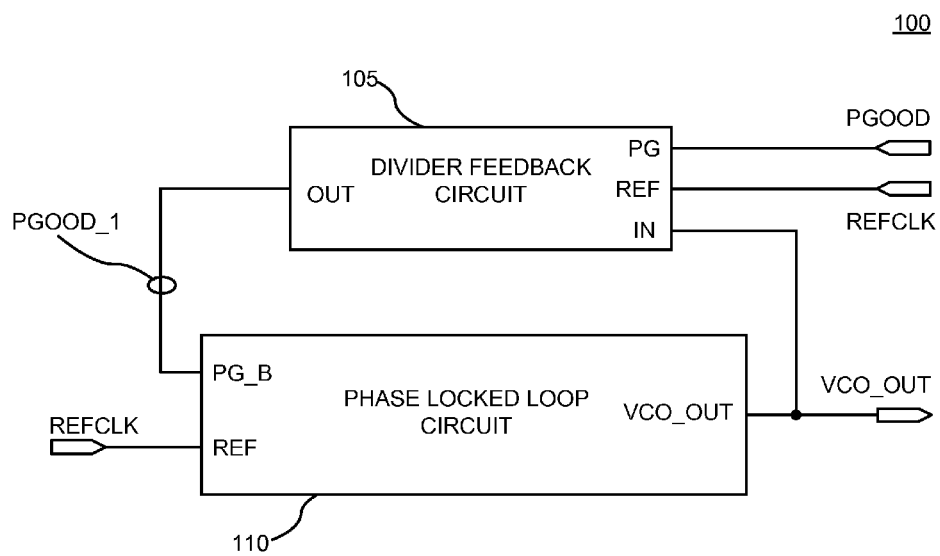
FIG. 1 depicts a block diagram of a circuit configured to prevent voltage controlled oscillator runaway, according to various embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to electronic circuits, more particular aspects relate to an electronic circuit that can prevent voltage controlled oscillator runaway in a phase locked loop circuit. While the present disclosure is not necessarily limited to such applications, various aspects of the disclosure may be appreciated through a discussion of various examples using this context.

Phase locked loop (PLL) circuits can include a phase detector circuit, a charge pump, a filter, a voltage controlled oscillator (VCO), and feedback path having a frequency divider. Embodiments of the present disclosure are based on the recognition that a low noise PLL circuit may require a low noise VCO design having a clean topology with low complexity along with a minimum of device and control lines. Low noise VCO designs, however, can have startup characteristics that can cause PLL runaway. A phase locked loop circuit having a low noise (and low power, and small area) VCO, for example, can experience runaway events shortly after power-up because of the history, body and self heating effects of the VCO's switching elements. The history, body and self heating effects may prevent a low noise VCO from oscillating until control voltages from the PLL are ramped up to voltages that are higher than the voltages required to cause the VCO to oscillate at its steady state (or normal operating) frequency. The result can be that, shortly after power-up, the VCO begins to oscillate at frequencies that are higher than the operating frequencies of the circuits fed by the VCO. This can cause a drop in the power supply to these circuits. One such circuit can be the phase locked loops feedback frequency divider circuit. Both the high operating frequency and the drop in power supply can cause the feedback frequency divider circuit to stop working or to work intermittently, preventing the VCO's output from being fed back to the PLL's phase detector. Under these conditions, a PLL circuit may modulate a control signal to its VCO to try to lock on a reference frequency. When the PLL circuit fails to sense the feedback from the VCO, the PLL (believing that the VCO is not oscillating) may increase the control voltages to the VCO, causing its output frequency to runaway (e.g., increase beyond the designed operating range).

Additional circuit elements can be added to the VCO design to compensate for the startup characteristics that contribute to VCO runaway, however the added circuitry can consume chip real estate and inject additional noise into the PLL circuit.

Embodiments of the present disclosure are directed toward a circuit and method that uses a pair of frequency dividers in a feedback path between a PLL circuit's low noise voltage controlled oscillator output and a control input to the PLL's phase detector to prevent VCO runaway. The circuit couples the output of the low noise VCO to the frequency input of a first frequency divider. The first frequency divider, after power-up, enables the PLL's control circuitry to provide an increasing control signal to start up the VCO. The increasing control signal can cause the VCO's output frequency to increase for a first oscillations threshold (e.g., a determined number of VCO oscillations). The first oscillations threshold can be experimentally chosen to allow enough time to attenuate the history, body and self heating effects. When the first oscillations threshold is reached, the first frequency divider causes PLL's control circuity to provide a decreasing control signal to the VCO. The decreasing control signal is provided until a second oscillations threshold of a reference signal oscillations (e.g., a determined number of reference signal oscillations), determined by a second frequency divider, is reached. The second oscillations threshold can be experimentally determined to allow the PLL circuit to return the frequency of the VCO's output signal to a level sufficiently below the maximum operating frequency of the PLL's feedback divider logic. Once the second oscillations threshold is reached, the second divider enables the PLL to begin locking onto the reference frequency.

The term "couple" or "coupled" includes indirect and direct electrical connection. Thus, if a first device is coupled to a second device, that connection may be through a direct electrical connection, or through an indirect electrical connection via other devices and connections.

Turning now to the Figures, FIG. 1 depicts a block diagram of a circuit 100 configured to prevent voltage controlled oscillator runaway, according various embodiments. The circuit 100 includes a phase locked loop (PLL) circuit 110 coupled to a divider feedback circuit 105. The PLL circuit 110 may receive as input a reference clock signal REFCLK and a control signal PGOOD_1 as inputs. The PLL circuit 100 may also produce an output signal VCO_OUT in response to REFCLK, PGOOD_1 and VCO_OUT. The divider feedback circuit 105 can produce an output signal PGOOD_1 in response to inputs received from VCO_OUT, REFCLK, and a power good signal PGOOD.

The divider feedback circuit's 105 operation and, consequently, the operation of the circuit 100, can be characterized in reference to three time periods, with each time period being marked by a state change (e.g., a change in voltage or drive level) in PGOOD_1. In the time period, occurring just after the PLL circuit 110 has powered up (e.g., power is supplied to the circuit and power supplies have stabilized), PGOOD_1 can be high (e.g., exhibit a high or positive voltage) and the PLL circuit 110 may enabled to provide an increasing control voltage to an internal VCO (e.g., a control voltage that increases in amplitude, or that commands the VCO to increase its oscillation frequency). The increasing control voltage may cause the internal VCO's output VCO_OUT to oscillate with increasing frequency. In some embodiments, the PLL circuit 110 may provide the increasing control voltage for a first time period, long enough to overcome the history, body and self heating effects. The first time period may be determined experimentally (e.g., by constructing or simulating the PLL circuit 110 and determining how much time, in terms of a number of VCO_OUT oscillations for example, is required to attenuate the history, body and self heating effect).

Divider feedback circuit 105 may switch to the second time period after detecting that VCO_OUT has oscillated long enough to reach the first oscillation threshold (e.g., a first threshold), determined as described herein. According to some embodiments, PGOOD_1 may be low in the second time period, switching the PLL circuit 110 to a low frequency mode. The PLL circuit 110 in the low frequency mode may provide a decreasing control voltage to the internal VCO (e.g., a voltage that causes the internal VCO's output VCO_OUT to decrease in frequency). According to certain embodiments PGOOD_1 may remain low for the second time period, long enough to further recover the history, body and self heating effects (e.g., to overcome any drops in the PLL's power supplies, and to reduce VCO_OUT's frequency to a frequency within the operating range of sub-circuits within the PLL circuit). The second time period may be determined experimentally (e.g., by constructing or simulating the PLL circuit 110 and determining how much time, in terms of a number of REFCLK oscillations for example, is required to recover from the history, body and self heating effect).

The divider feedback circuit 105 may begin the third time period after the second time period has expired (e.g., after REFCLK has oscillated long enough to meet the second oscillation threshold). In the third time period, PGOOD_1 may be high, allowing the phase locked loop circuit 110 to modulate the control signal to its internal VCO try to lock on to reference frequency REFCLK.

Although the embodiments described herein may refer to a single signal PGOOD_1 used to control the operation of the phase locked loop circuits described herein, this is done for simplification of the discussion, and it should be understood that the phase locked loop circuits can be controlled by one or more control signals. Additionally, the states of the control signals may be different that described herein so long as the logic is consistent with this discussion (e.g., in some embodiments, PGOOD_1 may be low in the first and third time periods, and high in the second time period).

Figure 2:
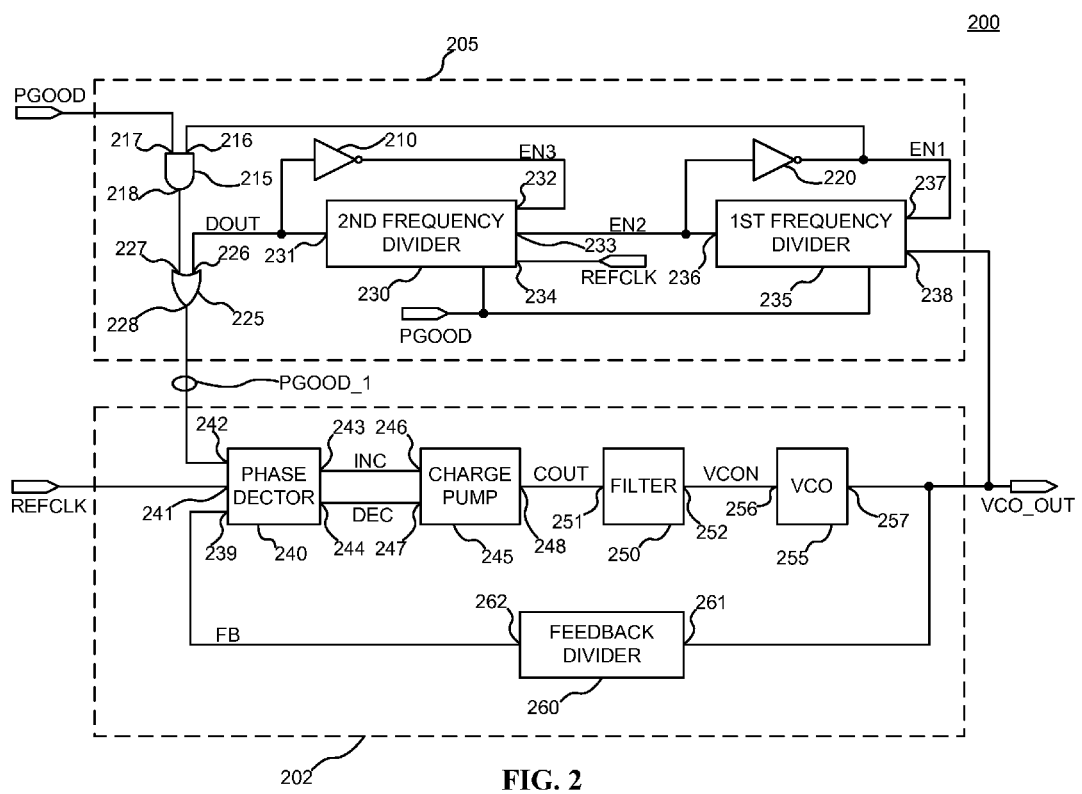
FIG. 2 depicts a block diagram of a more detailed view of a circuit configured to prevent voltage controlled oscillator runaway, according to various embodiments.

FIG. 2 depicts a block diagram of a more detailed view of a circuit 200 configured to prevent voltage controlled oscillator runaway, according various embodiments. The circuit 200 can be an embodiment of the circuit 100 shown in FIG. 1. Similar to the circuit 100, the circuit 200 includes a phase locked loop circuit 202 coupled to a divider feedback circuit 205. The coupling between the phase locked loop circuit 202 and the divider feedback circuit 205, along with the inputs and outputs associated with each circuit, is described for the phase locked loop circuit 110 and the divider feedback circuit 105 in FIG. 1.

The phase locked loop circuit 202 can include a phase detector circuit 240, charge pump circuit 245, filter circuit 250, voltage controlled oscillator circuit 255, and feedback divider circuit 260. In some embodiments, the filter 250 may be implemented as a low pass filter. The VCO 255 may present a signal VCO_OUT at an output 257 in response to a VCO control signal VCON (e.g., a control voltage corresponding with a VCO output frequency) received at an input

256. The filter 250 may present the signal VCON at an output 252 in response to a signal COUT received at an input 251. The charge pump 245 may present the signal COUT at an output 248 in response to a first signal INC received at a first input 246 as well as a second signal DEC received at a second input 247. In various embodiments, COUT and VCON may be differential signals. In particular embodiments, both the charge pump 245 and the filter 250 may be implemented in a single sub-circuit. The phase detector 240 may produce a first signal INC at an output 243 and a second signal DEC at a second output 244 in response to a first signal PGOOD_1 received at a first input 242, a second signal REFCLK received at a second input 241, and a third signal FB received at a third input 239. In some embodiments, REFCLK may be a reference signal having a particular frequency. The feedback divider 260 may produce a signal FB at an output 262 in response to the signal VCO_OUT received at an input 261.

According to various embodiments, PGOOD_1 in the first time period (e.g., when PGOOD_1 is a high voltage) may cause the phase locked loop 202 to try lock on to REFCLK (e.g., cause VCO_OUT to correspond in phase and frequency to REFCLK). In this first time period, phase detector 240 may produce an increment signal INC to increase the frequency of VCO_OUT, or a decrement signal DEC to decrease the frequency of VCO_OUT in response to a phase and/or frequency difference detected between FB and REFCLK. Signal PGOOD_1, in the second time period (e.g. when PGOOD_1 is low), may cause the phase locked loop 202 to enter a low frequency mode. According to various embodiments, in this second time period, phase detector 240 may produce a decrement signal DEC to reduce the frequency of VCO_OUT.

The divider feedback circuit (or block) 205 can include a first frequency divider circuit 235, a second frequency divider circuit 230, inverters 210 and 220, AND logic gate 215, and OR logic gate 225. In some embodiments, the first frequency divider 235 and the second frequency divider 230 may be counters. The first frequency divider circuit can sample the VCO output signal VCO_OUT received at an input 238 and produce a signal EN2 at output 236 after VCO_OUT has oscillated long enough to meet the first oscillation threshold, as detected by the first frequency divider circuit. In some embodiments, EN2 can be at a low voltage after the circuit 200 is powered up, and may be switched to a high voltage after the first frequency divider 235 detects the first oscillations threshold number of VCO_OUT oscillations. Inverter 220 may receive the signal EN2 and produce a signal EN1. The first frequency divider 235 may receive the signal EN1 at an input port 237. The second frequency counter 230 may produce a signal DOUT at an output 231 in response to a signal EN3 received at an input 232, the signal EN2 received at an input 233, and the signal REFCLK received at an input 234. Inverter 210 may produce the signal EN3 in response to receiving the signal DOUT. The AND logic gate 215 may produce a signal at an output 218 in response to receiving the signal EN1 at an input 216 and a signal PGOOD (e.g., a second control signal) at an input 217. The OR logic gate 225 may produce a signal PGOOD_1 at an output 228 in response to receiving a signal from the AND logic gate 215 at an input 227, and the signal DOUT at an input 226. The first frequency divider is simple and designed in a manner such that it is easily operate at the frequency range that the VCO 255 starts at.

According to various embodiments, at the start of the first time period (as described herein) the power supplies (not shown) to the circuit 200 have powered up and stabilized, PGOOD may be at a high voltage, REFCLK can be oscillating at a given frequency, and the VCO 255 may not be oscillating. The first frequency divider 235 may be configured with PGOOD to drive EN2 low until the first frequency divider detects enough oscillations of VCO_OUT to meet the first oscillation threshold (e.g. after 128 oscillations of VCO_OUT), at which point the first frequency divider 235 may start driving EN2 high. Consequently, EN1 may be high after the circuit 200 powers up and before the first frequency divider 235 detects the first oscillation threshold number of VCO_OUT oscillations. The AND logic gate 215 will drive OR logic gate's 225 input 227 high in response to both PGOOD and EN1 being high, resulting in the OR logic gate driving PGOOD_1 high. Driving PGOOD_1 high can cause the phase detector 240 to command an increasing control voltage VCON (e.g., by driving the increment signal INC) to VCO 255. When VCON reaches a threshold determined by the VCO 255's design (e.g., transistor thresholds, along with the history, body and self heating effects), the VCO will produce oscillating signal VCO_OUT.

The second time period, as described herein, may begin when the first frequency divider detects the first oscillation threshold number of VCO_OUT oscillations (e.g., after 128 oscillations of VCO_OUT are detected). The first frequency divider 235, configured, for example, to divide the VCO_OUT's frequency by 128, may drive EN2 high, causing inverter 220 to drive EN1 low. Driving EN1 low may disable the first frequency divider 235 (e.g., the first frequency divider may stop detecting/sampling VCO_OUT, while continuing to drive EN2 high). Driving EN2 high can enable the second frequency divider 230. The signal DOUT may be low until the second frequency divider 230 drives it high after detecting the second threshold number REFCLK oscillations (e.g., after 32 oscillations of REFCLK) subsequent to EN2 going high. The OR logic gate may drive PGOOD_1 low in response to EN1 and DOUT driving low. Driving PGOOD_1 low switches the PLL circuit 202 to a low frequency (and low control voltage) mode and can cause phase detector 240 to drive VCON to decrement the frequency of VCO_OUT (e.g., by driving the decrement signal DEC).

A third time period may begin after the second frequency divider 230 samples, for example, 32 oscillations of REFCLK. According to some embodiments, the number of cycles may be programmable. In this time period, the second frequency divider 230 may drive DOUT high, causing inverter 210 to drive EN3 low and disabling the second frequency divider. The third time period can be characterized by the OR logic gate driving PGOOD_1 high in response to DOUT being high. Driving PGOOD_1 high may cause the phase locked loop 202 to return to a normal operating mode where the phase detector 240 can modulate INC and DEC to lock on to REFCLK.

Figure 3:
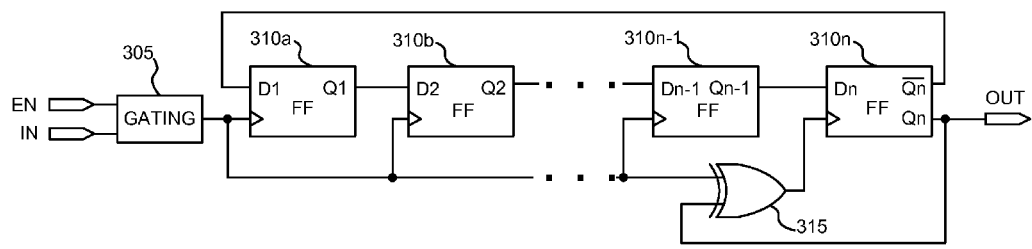
FIG. 3 depicts a block diagram of a frequency divider circuit constructed from flip-flops, according to various embodiments.

FIG. 3 depicts a block diagram of a frequency divider circuit 300 constructed from flip-flops, according to various embodiments. The frequency divider circuit 300 can be an embodiment of the first and second frequency dividers discussed in FIG. 2, and may include gating (or enable) sub-circuit 305, exclusive-OR logic gate 315, and n clocked flip-flops 310*a*, 310*b*, and 310*n*−1 to 310*n*. The gating sub-circuit 305 includes enable input EN (e.g., input 237 of the first frequency divider 235 in FIG. 2) and frequency/clock input IN (e.g., input 234 or 238 in FIG. 2). According to some embodiments, EN may include one or more enable signals (e.g., inputs 232 and 233 of the second frequency divider 230 in FIG. 2), each of which may be required to enable clock input EN to be passed to the flip-flops and the exclusive OR logic gate 315. The frequency divider circuit 300 may drive a signal OUT (e.g., EN2 or DOUT in FIG. 2), in response to sampling a given threshold number of oscillations of the clock signal IN while the enable signal EN is present, thus dividing the frequency of IN by the threshold number. According to some embodiments, the frequency of an input signal IN can be divided by 2n−1, where 'n' is number of flip-flops used to construct frequency divider 300.

Although frequency divider 300 shown in FIG. 3 is constructed with clock D-type flip-flops, other devices may be used (e.g., memory devices including T-type flip-flops, or J-K flip-flops). In some embodiments, counters can be substituted for the frequency dividers. The device used (frequency dividers or counters) can be selected to so that their maximum operating frequency is higher than that of the sub-circuits in a PLL's feedback divider path (e.g., feedback divider 260 shown in FIG. 2). Frequency dividers or counters constructed from simple configurations of basic logic gates may meet this requirement.

Figure 4A:
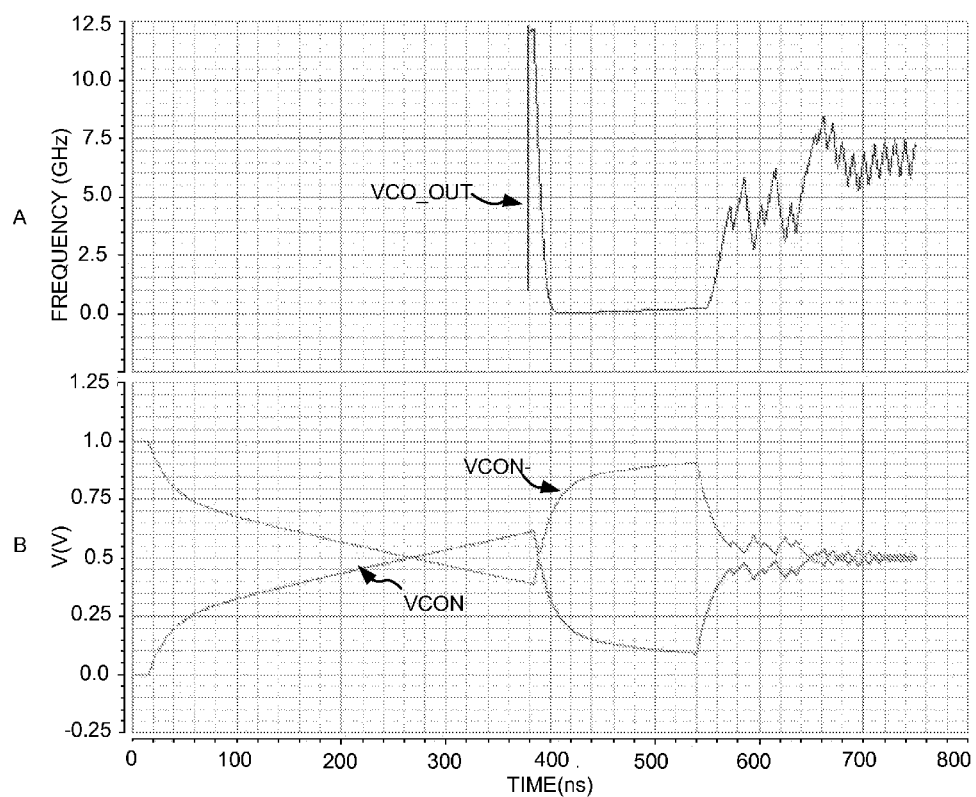
FIG. 4a depicts a set of plots generated from a simulation of an exemplary embodiment of a circuit configured to prevent voltage controlled oscillator runaway, according to various embodiments.
Figure 4B:
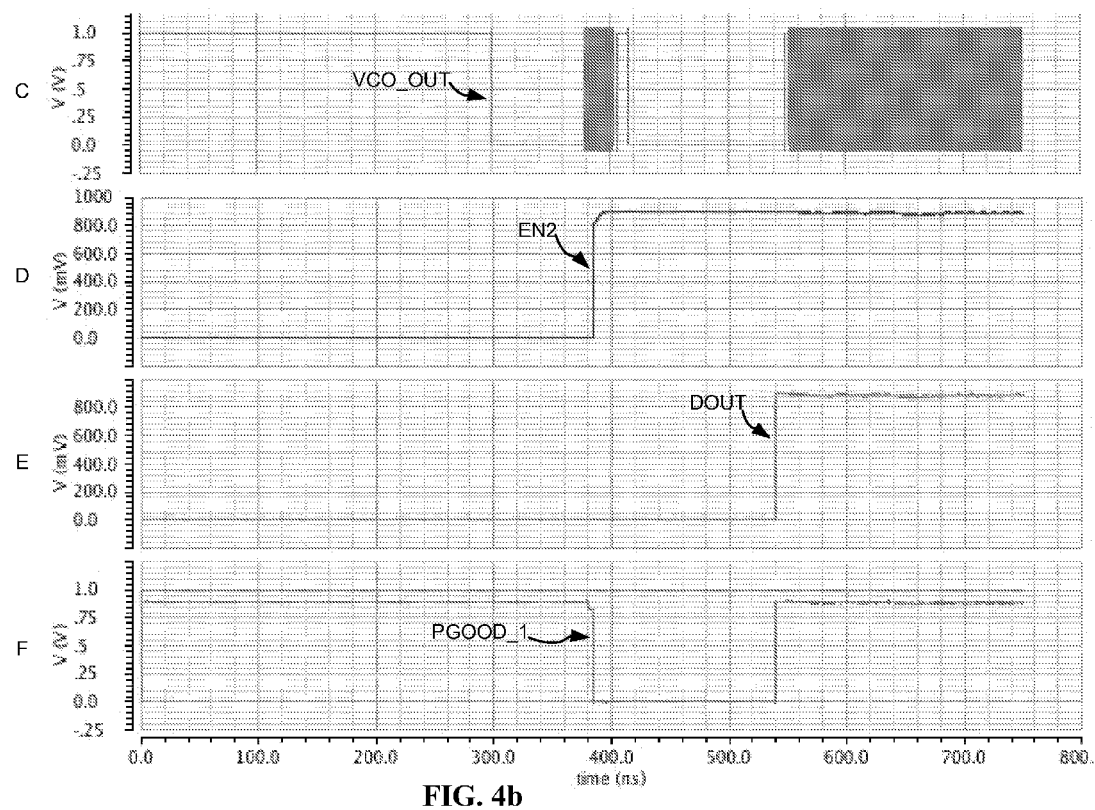
FIG. 4b shows a second set of plots generated from a simulation of an exemplary embodiment of a circuit configured to prevent voltage controlled oscillator runaway, according to various embodiments.

FIGS. 4a and 4b depict plots generated from a simulation of an exemplary embodiment of a circuit configured to prevent voltage controlled oscillator runaway, according to various embodiments. The simulated circuit may be an embodiment of the circuit 200 shown in FIG. 2. FIG. 4a shows a plot of the PLL circuit's VCO output frequency (sub-plot A) in giga-cycles per second (GHz), and a plot of the control voltage to the VCO (sub-plot B) corresponding with the output frequency. FIG. 4b shows voltage plots of the VCO output frequency (sub-plot C), the output of a first frequency divider (sub-plot D), the output of a second frequency divider (sub-plot E), and a PGOOD_1 signals (sub-plot F).

FIG. 4a and FIG. 4b shows that the first time period, as described herein, begins at time 0 and lasts until approximately time 385 ns. During the time period, PGOOD_1 (sub-plot F) is high and the outputs of the first and second frequency dividers (respectively, sub-plots D and E) are low. Additionally, during the first time period, sub-plot B shows an increasing VCO control signal (e.g., VCON) ramp-up to turn on the VCO. Sub-plot B shows the VCO control signal as a differential pair consisting of VCON and VCON−. Sub-plot A and C show the VCO's output signal (e.g., VCO_OUT) begin to oscillate and increase in frequency as VCON reaches a threshold. During this first time period, VCO_OUT's frequency approaches 12.5 GHz, a frequency which, if left on corrected, may cause some sub-circuits the PLL (e.g. feedback divider 260 in FIG. 2) to malfunction resulting in VCO runaway.

The second time period, as described herein, begins at approximately 385 ns and is initiated by the output of a first frequency divider (e.g., EN2) driving high (e.g., after sampling 128 oscillations of VCO_OUT) and PGOOD_1 driving low, as shown in sub-plots D and F respectively. The second time period extends until time 540 ns. During the second time period the PLL commands a decreasing voltage on VCON, reducing VCO_OUT's frequency.

The third time period, as described herein, begins at approximately 540 ns and is marked by the second frequency divider's output (e.g. DOUT), and PGOOD_1 driving high. The transition to the third time period may have been precipitated by the second frequency divider sampling 32 oscillations of a reference clock signal (not shown). Sub-plot B shows that VCON increases for a time in the third time period and then starts to oscillate as the PLL tries to lock on to the reference clock signal (e.g., REFCLK, not shown). Sub-plots A and C show VCO_OUT's frequency modulate, in the third time period, in response to VCON.

Figure 5:
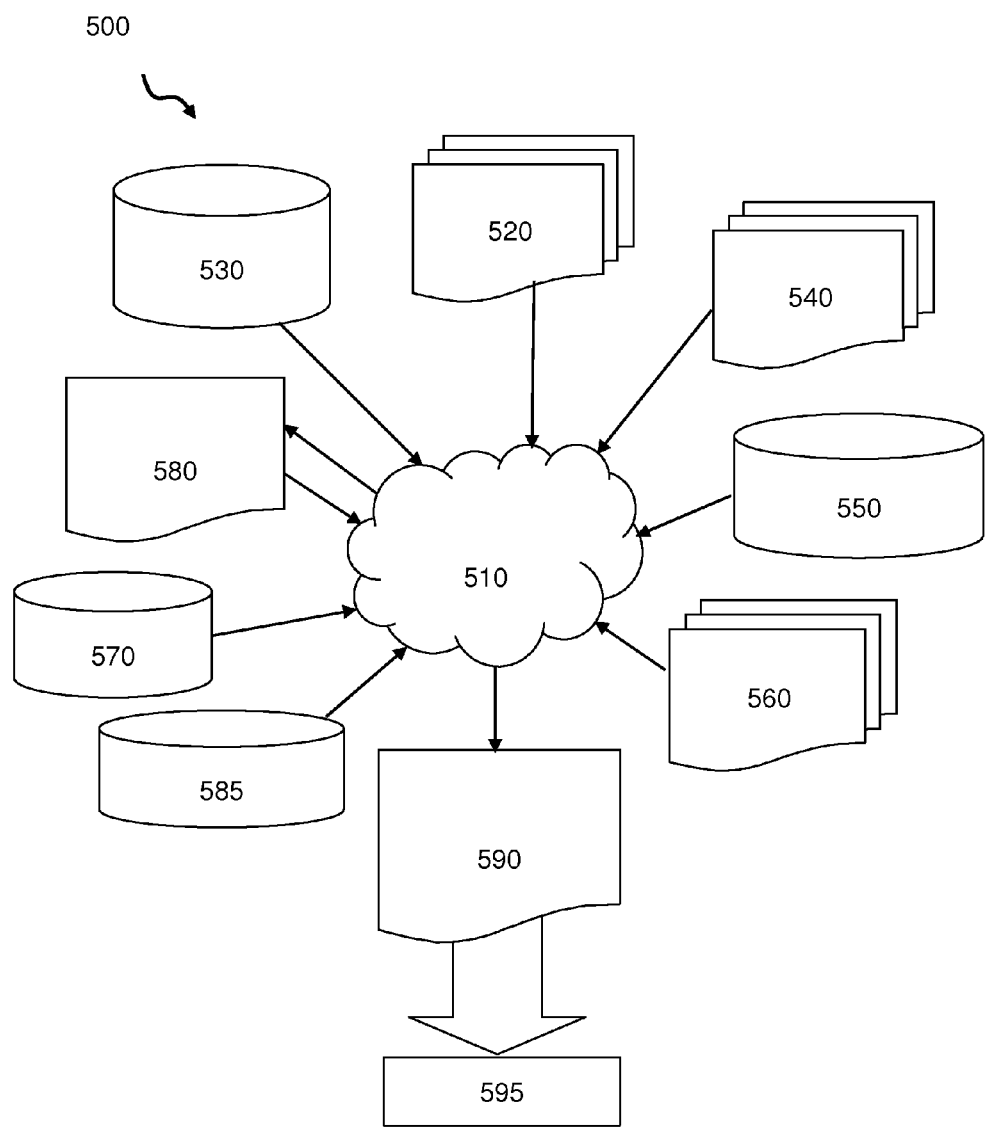
FIG. 5 is a flow diagram of a design process used in semiconductor design, manufacture, and/or test.

FIG. 5 shows a block diagram of an exemplary design flow 500 used for example, in semiconductor IC logic design, simulation, test, layout, and manufacture. Design flow 500 includes processes, machines and/or mechanisms for processing design structures or devices to generate logically or otherwise functionally equivalent representations of the design structures and/or devices described above and shown in FIGS. 1-4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIGS. 1-4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIGS. 1-4 to generate a Netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which Netlist 580 is resynthesized one or more times depending on design specifications and parameters for the device. As with other design structure types described herein, Netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including Netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4. In one embodiment, design structure 590 may comprise a compiled, executable HDL simulation model that functionally simulates the devices shown in FIGS. 1-4.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4. Design structure 590 may then proceed to a stage 595 where, for example, design structure 590: proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A method for preventing voltage controlled oscillator (VCO) runaway in a phase locked loop (PLL) circuit, comprising:
   providing a feedback module having a first, a second, and a third input to receive a first output signal from a PLL circuit, and a reference signal and a first control signal; and
   generating a second control signal from a feedback circuit, the second control signal being coupled to an input of the PLL circuit,
      wherein the feedback circuit generates the second control signal by comparing a number of cycles of the first output signal to a first threshold, and a number of cycles of the reference signal to a second threshold.

2. The method of claim 1, wherein generating the second control signal further comprises:
   generating by a first frequency divider a second output signal in response to the first output signal, and the second output signal;
   generating by a second frequency divider a third output signal in response to the reference signal, the second output signal, and the third output signal; and
   producing by a plurality of logic elements the control signal in response to the second output signal, the third output signal, and the first control signal.

3. The method of claim 2, wherein the first frequency divider and the second frequency divider are counters.

4. The method of claim 1, wherein generating the second control signal further comprises:
   driving the second control signal to a first value for a first time period and a second time period; and
   driving the second control signal to a second value for a third time period occurring between the first and second time periods, wherein the first, second and third time periods are determined by the first control signal and the first and second frequency dividers.

5. The method of claim 1, wherein the feedback circuit comprises:
a plurality of memory elements.

6. The method of claim 1, wherein the phase locked loop comprises:
a phase detector;
a voltage controlled oscillator; and
a charge pump circuit and a filter circuit configured between the phase detector and the voltage controlled oscillator.

* * * * *